United States Patent
Albu et al.

(10) Patent No.: US 6,670,941 B2
(45) Date of Patent: Dec. 30, 2003

(54) SLOW RATE CONTROLLED RAMP AND ITS USE IN LIQUID CRYSTAL DISPLAYS

(75) Inventors: Lucian Remus Albu, New York, NY (US); Peter J. Janssen, Scarborough, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 243 days.

(21) Appl. No.: 09/982,893

(22) Filed: Oct. 22, 2001

(65) Prior Publication Data

US 2003/0076285 A1 Apr. 24, 2003

(51) Int. Cl.$^7$ ................................................ G09G 3/36
(52) U.S. Cl. ............................ 345/98; 345/99; 345/87; 345/211; 345/94
(58) Field of Search ...................... 345/87, 94, 98–100, 345/205, 211–213; 330/252–261, 278, 291, 294

(56) References Cited

U.S. PATENT DOCUMENTS

| | | | | |
|---|---|---|---|---|
| 5,363,059 A | | 11/1994 | Thiel | 330/253 |
| 5,623,279 A | * | 4/1997 | Itakura et al. | 345/98 |
| 5,627,457 A | * | 5/1997 | Ishiyama et al. | 323/318 |
| 6,222,418 B1 | * | 4/2001 | Gopinathan et al. | 330/292 |
| 6,373,419 B1 | * | 4/2002 | Nakao | 341/154 |
| 6,384,679 B1 | * | 5/2002 | Lorenz | 330/51 |
| 6,433,637 B1 | * | 8/2002 | Sauer | 330/255 |

* cited by examiner

Primary Examiner—Kent Chang
Assistant Examiner—Tommy Sheng

(57) ABSTRACT

An operational transconductance amplifier (OTA) circuit, and a liquid crystal display that uses such an OTA circuit, having a controlled slew rate. The OTA has an output that drives a load, beneficially a liquid crystal display panel. That OTA includes a first current source that sinks a first tail current, and a second current source that selectively sinks a second tail current. That second current source is selected by a control signal applied to a switch. When the second current source sinks the additional second tail current the slew rate of the OTA is increased. When used in a liquid crystal display, the OTA drives the liquid crystal display panel with a ramp. During ramp fly back, the second current source sinks the second tail current and increases the slew rate.

20 Claims, 5 Drawing Sheets

SLOW RATE CONTROLLED RAMP AND ITS USE IN LIQUID CRYSTAL DISPLAYS

BACKGROUND OF THE INVENTION

1. Field of the Invention

The present invention relates to liquid crystal displays. More specifically, it relates to reducing flicker in liquid crystal displays.

2. Discussion of the Related Art

Producing a color image using a Liquid Crystal Display (LCD) is well known. Such displays are particularly useful for producing images that are updated by frames, such as in color televisions. Typically, each image frame is composed of color sub-frames, usually red, green and blue sub-frames.

Such LCD systems employ a light crystal light panel that is comprised of a large number of individual liquid crystal pixel elements. Those pixel elements are beneficially organized in a matrix comprised of pixel rows and pixel columns. To produce a desired image, the individual pixel elements are modulated in accordance with image information. Typically, the image information is applied to the individual pixel elements by rows, with each pixel row being addressed in each frame period.

Pixel element matrix arrays are preferably "active" in that each pixel element is connected to an active switching element of a matrix of such switching elements. One particularly useful active matrix liquid crystal display is the reflective active-matrix liquid crystal display (RLCD). An RLCD display is typically produced on a silicon substrate and is often based on the twisted nematic (TN) effect. Thin film transistors (TFTs) are usually used as the active switching elements. Such RLCD displays can support a high pixel density because the TFTs and their interconnections can be integrated onto the silicon substrate.

FIG. 1 schematically illustrates a single pixel element 10 of a typical RLCD. The pixel element 10 is comprised of a twisted nematic liquid crystal layer 12 that is disposed between a transparent electrode 14 and a pixel electrode 16. For convenience, FIG. 1 shows the transparent electrode applied to a common ground. Additionally, a storage element 18 is connected to complementary data terminals 20 and 22. The storage element receives control signals on a control terminal 24. In responsive to a "write" control signal the storage element 18 selectively latches the data signal on one of the data terminals 20 and 22, and applies that latched signal to the pixel electrode 16 via a signal line 26. The data signals on the data terminals 20 and 22 are complementary. That is, when one line is at +2 volts, the other is at –2 volts.

Still referring to FIG. 1, and as explained in more detail subsequently, the liquid crystal layer 12 rotates the polarization of the light 30, with the amount of polarization rotation dependent on the voltage across the liquid crystal layer 12. Ideally, the pixel element 10 is symmetrical in that the polarization rotation depends only on the magnitude of the latched signal on the signal line 26. By alternating complementary signals in consecutive frames, unwanted charges across the liquid crystal layer 12 are prevented. If only one polarity was used, ions would build up across the capacitance formed by the transparent electrode 14, the liquid crystal layer 12, and the pixel electrode 16. Such charges would bias the pixel element 10.

The light 30 is derived from incident non-polarized light 32 from an external light source (which is not shown). The non-polarized light is polarized by a first polarizer 34 to form the light 30. The light 30 passes through the transparent electrode 14, through the liquid crystal layer 12, reflects off the pixel electrode 16, passes back through the liquid crystal layer 12, passes out of the transparent electrode 14, and then is directed onto a second polarizer 36. During the double pass through the liquid crystal layer 12 the polarization of the light beam is rotated in accord with the magnitude of the voltage on the signal line 26. Only the portion of the light 30 that is parallel with the polarization direction of the second polarizer 36 passes through that polarizer. Since the passed portion depends on the amount of polarization rotation, which in turn depends on the voltage on the signal line 26, the voltage on the signal line controls the intensity of the light that leaves the pixel element.

The storage element 18 is typically a capacitor connected to a thin film transistor switch. When a control signal is applied to the gate electrode of the thin film transistor that transistor turns on. Then, the voltage applied to the source of the thin film transistor passes through the thin film transistor and charges the capacitor. When the control signal is removed, the thin film transistor opens and the capacitor potential is stored on the pixel electrode 16.

FIG. 2 schematically illustrates a pixel element matrix. As shown, a plurality of pixel elements 10, each having an associated switching thin film transistor and a storage capacitor, are arranged in a matrix of rows (horizontal) and columns (vertical). For simplicity, only a small portion of a matrix array is shown. In practice there are numerous rows, say 1290, and numerous columns, say 1024. Referring to FIG. 2, the pixel elements of a row are selected together by applying a gate (switch) control signal on a gate line, specifically the gate lines 40a, 40b, and 40c. A constant voltage (which is shared by all of the pixel elements) is applied to the transparent electrode 14 from a ramp source 41 via a line 42. Furthermore, the ramp source 41 applies complementary ramp signals on lines 20 and 22 (which are also shared by all of the pixel elements 10). Furthermore, column select lines 46a, 46b, and 46c, control the operation of the pixel elements 10.

In practice, a row of pixel elements is selected by the application of a signal on an appropriate one of the gate lines 40a–40c. This turns on all of the pixel elements in that row. Then, the ramp source 41 applies a ramp to either line 20 or line 22 (which line is used is varied in each frame). The ramp begins charging all of the storage capacitors in the selected row. As the other rows are not energized, the ramp source only charges the OFF-state capacitance of the other pixels. When the ramp voltage reaches the desired state for a particular pixel, the column select line (46a–46c) voltage for that particular pixel element 10 turns the pixel switch OFF. Then, the ramp voltage that existed when the particular pixel element 10 was turned OFF is stored on that element's storage capacitor. Meanwhile, the ramp voltage continues to increase until all of the column select lines (46a–46c) cause a ramp voltage to be HELD on an associated pixel element. After that, a new row of pixel elements is selected and the process starts over. After all rows have been selected, the process starts over again in a new frame period, this time using the complement of the previous ramp.

The foregoing process is generally well known and is typically performed using shift registers, microcontrollers, and ramp generators. In practice, Operational Transconductance Amplifier (OTA) ramp sources are commonly used. Reasons for this include the wide dynamic range and operational bandwidths of OTAs. An OTA is a current controlled resistance amplifier that is similar to operational amplifiers, except that an OTA uses differential input current to control an output, rather than a differential voltage. Thus, an OTA includes differential inputs.

While RLCD displays are generally successful, they have problems. For example, driving a row of pixel elements using a relatively slowly changing voltage ramp, and then rapidly discharging that ramp to prepare for driving the next row of pixel elements can lead to various problems, including ramp overshoot and high power dissipation. To understand these problems, consider a ramp signal applied to an RLCD display. To a first order, the RLCD display can be modeled as a capacitance $C_{RLCD+}$. The + designates that pixel elements are switched on such that current must flow into the storage elements. The OTA that produces the ramp must have a minimum slew-rate of:

$$SR_{RLCD+} = \alpha(V_{maxramp} - V_{minramp}) t_{ramp}$$

which leads to the required OTA current of:

$$I_{RLCD+} = (SR_{RLCD+})(C_{RLCD+})$$

where:
- $SR_{RLCD+}$ is the required slew rate when charging the storage elements of a row;
- $\alpha$ is an amplification factor determined by the required gain;
- $V_{max\_ramp}$ is the maximum ramp voltage;
- $V_{min\_ramp}$ is the minimum ramp voltage;
- $t_{ramp}$ is the ramp up time;
- $I_{RLCD+}$ is the maximum charging current during ramp up;
- $SR_{RLCD+}$ is the minimum required slew rate during ramp up; and
- $C_{RLCD+}$ is the maximum capacitance of the RLCD during ramp up.

Now, consider the minimum required ramp slew-rate when discharging the ramp to prepare for the next row of pixel elements:

$$SR_{RLCD-} = \alpha(V_{max\_ramp} - V_{min\_ramp}) t_{fb},$$

which leads to the required OTA current of:

$$I_{RLCD-} = (SR_{RLCD-})(C_{RLCD-})$$

where:
- the– designates that current is not flowing into the storage elements;
- $SR_{RLCD-}$ is the required slew rate when discharging the ramp;
- $t_{fb}$ is the ramp down (fly back) time;
- $I_{RLCD-}$ is the maximum charging (discharge) current during fly back;
- $SR_{RLCD-}$ is the minimum required slew rate during fly back; and
- $C_{RLCD-}$ is the maximum capacitance of the RLCD during fly back.

Since $t_{ramp}$ is >>$t_{fb}$, there is a general requirement that $SR_{RLCD-}$>>$SR_{RLCD+}$. To accommodate the faster slew rate ($SR_{RLCD-}$), the ramp source is usually designed to handle the greater signal slew (and thus current) over the entire ramp cycle, in spite of the fact that the greater current handling capability is only needed for a relatively small part of each ramp cycle. This leads to high power dissipation and to inherent instabilities (such as ramp signal overshoot).

Therefore, a ramp source having a faster slew rate during ramp fly back would be beneficial. Even more beneficial would be a ramp source having a slew rate under the control of an external signal. Still more beneficial would be an OTA circuit having a slew rate controlled by an external signal. Such ramp sources and circuits would be particularly useful in liquid crystal display devices.

SUMMARY OF THE INVENTION

Accordingly, the principles of the present invention provide for operational transconductance amplifier (OTA) circuits having slew rates controlled by external signals, for ramp sources having increased slew capability during ramp fly back, and for liquid crystal display devices having ramp sources with controlled slew rates.

A circuit according to the principles of the present invention includes an operational transconductance amplifier (OTA). The OTA has an output that drives a load, which is beneficially a liquid crystal display panel. The OTA circuit includes a first current source that sinks a first tail current, and a second current source that selectively sinks a second tail current. The second current source is selected by a control signal applied to a switch. When the second current source sinks the additional second tail current the slew rate of the OTA is increased. When used as a ramp source, the OTA circuit receives a ramp input that is applied to the non-inverting input of the OTA. Then, the slew rate is increased during ramp fly back. When used in a liquid crystal display, the OTA circuit drives a liquid crystal display panel with a ramp such that the ramp's slew rate is increased during fly back.

Additional features and advantages of the invention will be set forth in the description that follows, and in part will be apparent from that description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an illustrated embodiment of the present invention, the example of which is shown in the accompanying drawings. That embodiment includes an OTA ramp source having increased drive capability during ramp fly back. Furthermore, that ramp source is used to drive a liquid crystal display.

Figure 1:
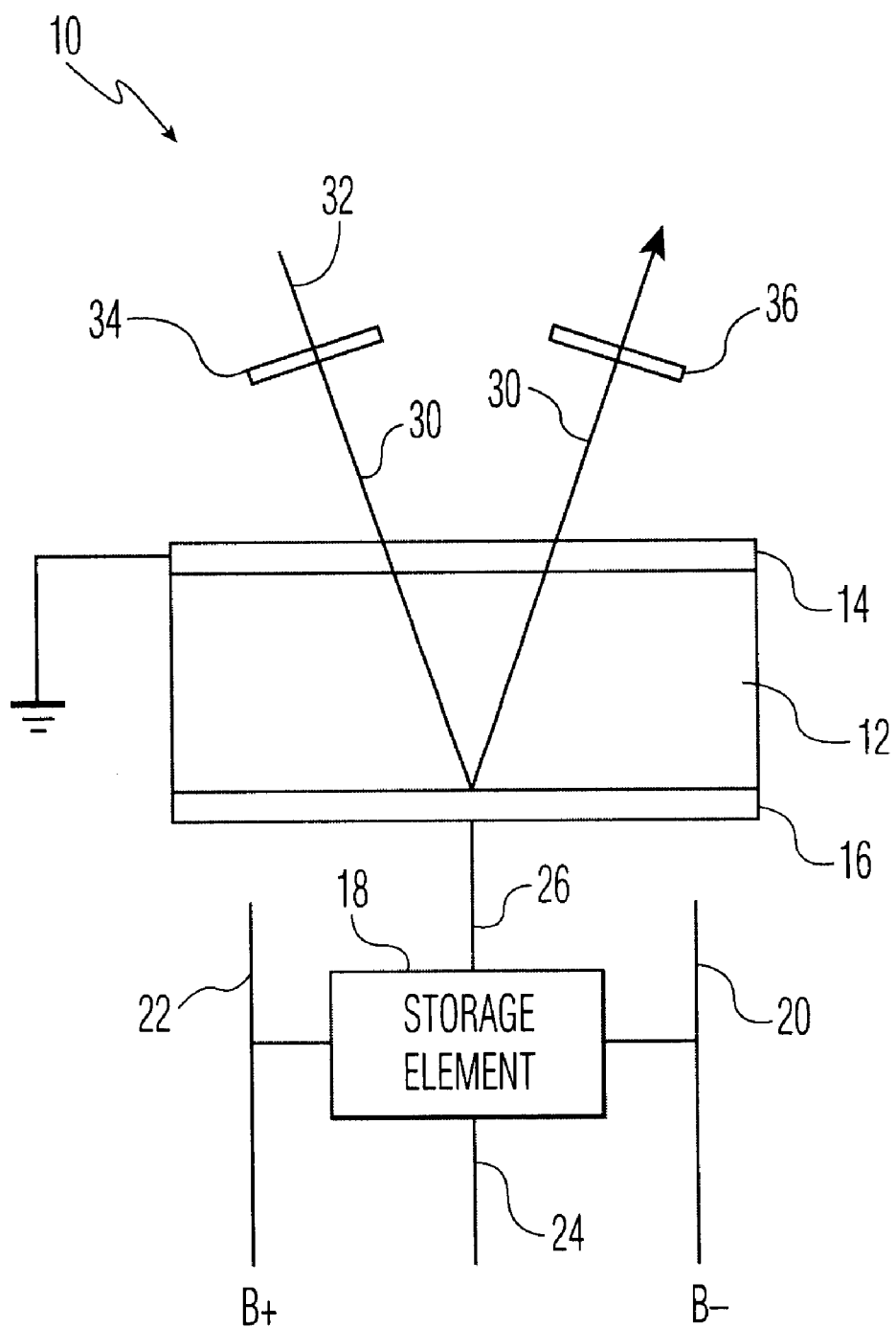
FIG. 1 schematically illustrates a prior art reflective liquid crystal pixel element.
Figure 2:
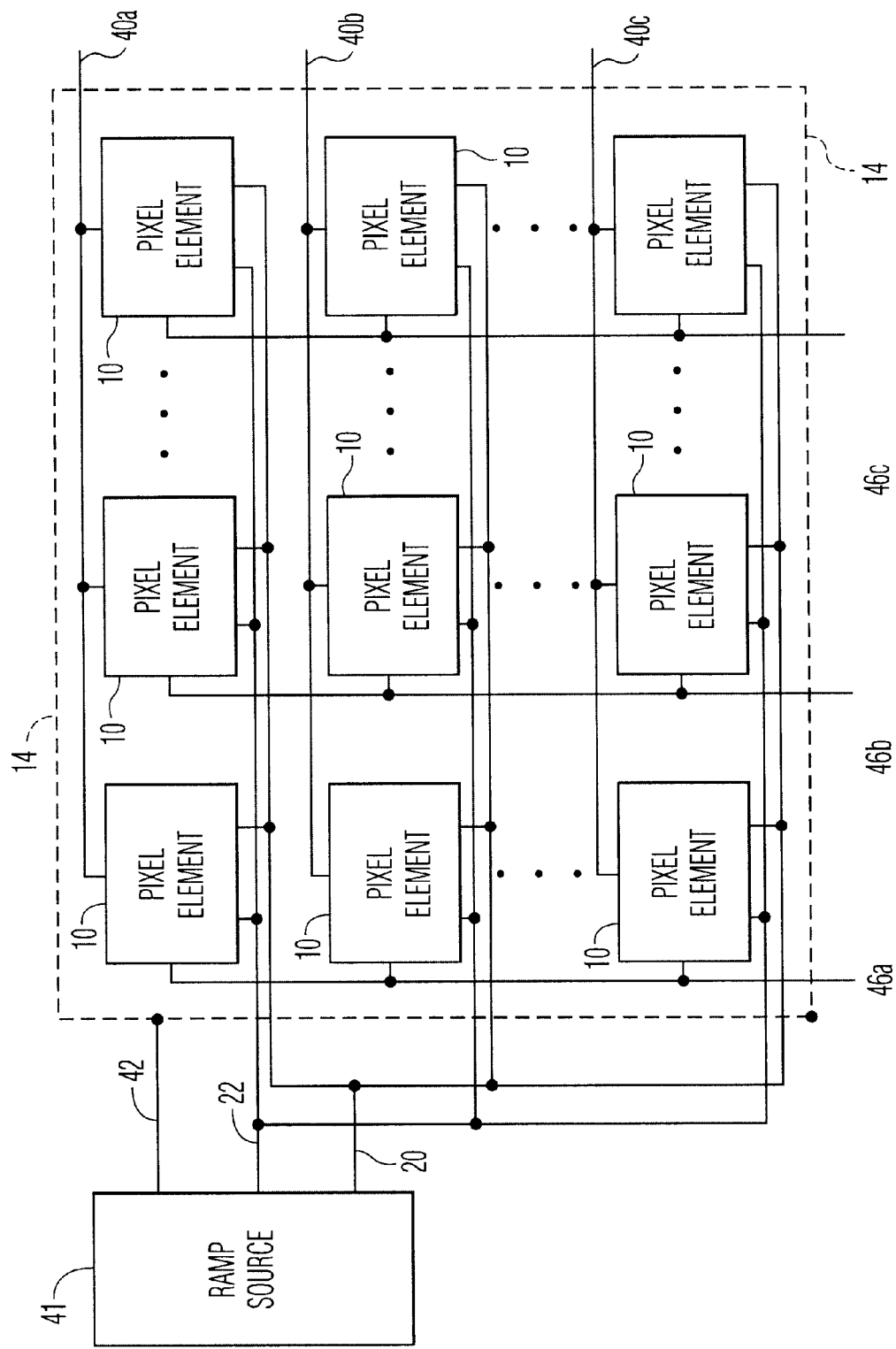
FIG. 2 schematically illustrates a prior art pixel element matrix.
Figure 3:
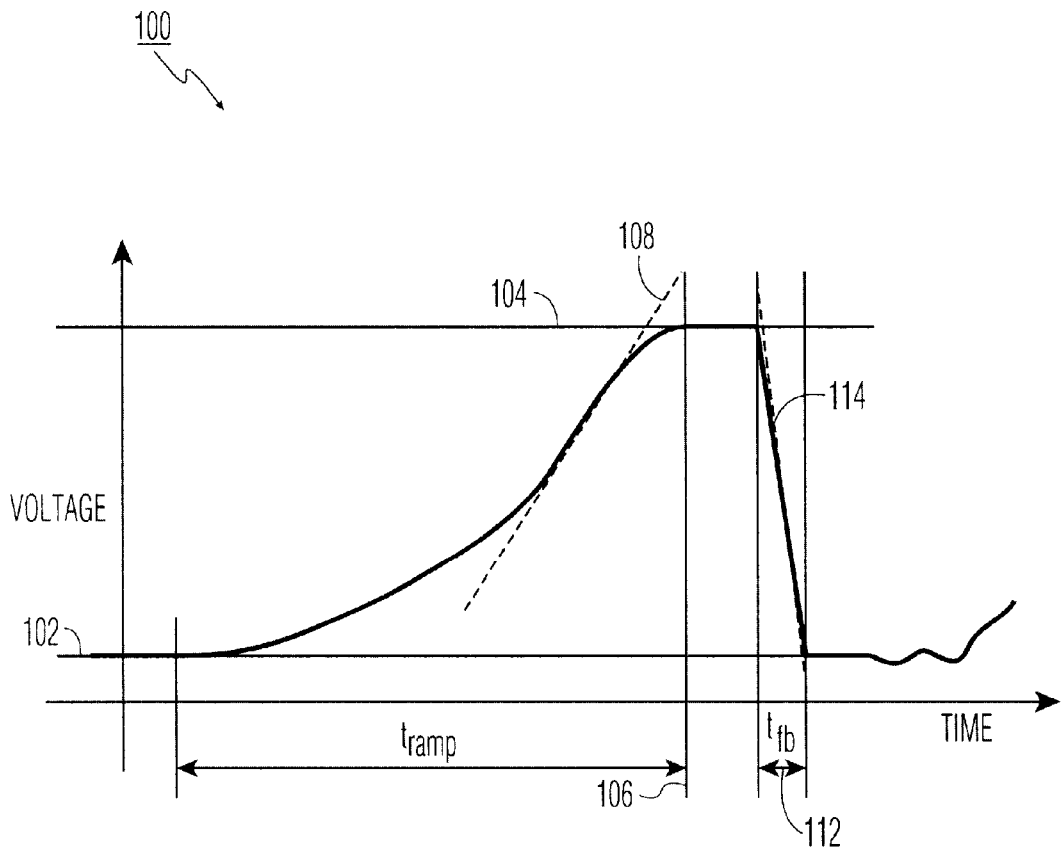
FIG. 3 illustrates exemplary ramp potentials.

As previously described, the ramp source 41 of FIG. 2 produces voltage ramps on lines 20 and 22. FIG. 3 illustrates one of those voltage ramps 100 (positive going). Since the other voltage ramp is an inverted (negative going) version of the voltage ramp of FIG. 3, it should be understood that the following refers to both ramps.

As shown in FIG. 3, the voltage ramp 100 begins at a minimum voltage $V_{min\_ramp}$ 102 and increases over time (horizontal axis) to a maximum voltage $V_{max\_ramp}$ 104 at a time $t_{ramp}$ 106. During that time the voltage ramp changes at a maximum rate $SR_{RLCD+}$ 108. The ramp source must be able to provide the required output power at the maximum rate $SR_{RLCD+}$ 108. Otherwise, the desired ramp profile cannot be obtained, resulting in an incorrect profile, which produces illumination distortion.

Still referring to FIG. 3, after $t_{ramp}$ 106 the maximum voltage is maintained for a short period of time. Then, in preparation for producing a ramp for the next row of pixel elements 10, the voltage ramp drops from $V_{max\_ramp}$ 104 to $V_{min\_ramp}$ 102 in a fly back time $t_{fb}$ 112. During fly back, the voltage profile changes at a maximum rate of $SR_{RLCD-}$ 114. The ramp source must be able to provide the required fly back output power at the rate $SR_{RLCD-}$ 114.

Figure 4:
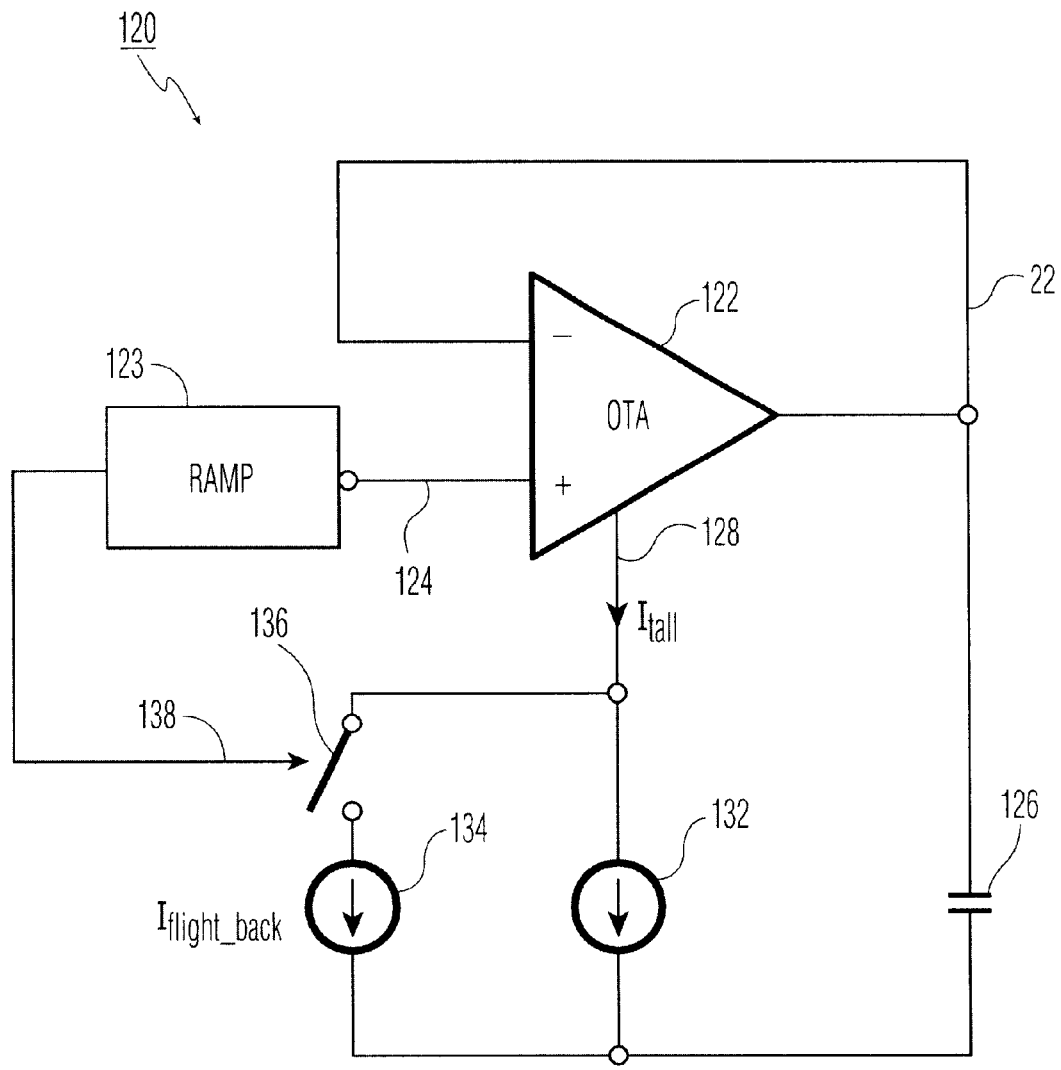
FIG. 4 schematically illustrates a ramp source for a liquid crystal display that incorporates the principles of the present invention.

An OTA based ramp source 120 that can provide the required power at the required slew rate $SR_{RLCD+}$ 108 while dissipating limited power, and at the required slew rate $SR_{RLCD-}$ 114 is illustrated in FIG. 4. An OTA 122 receives a ramp input having the desired shape on a line 124 from a ramp generator 123. In response, the OTA 122 drives the RLCD display 126, which is modeled as a capacitor C. The capacitance of the RLCD display 126 will vary in accord with the image produced by a given row of pixel elements. The slew rate of the OTA 122 is a function of the "tail current" through the OTA mirror. That tail current is output on a tail current line 128.

The slew rate $SR_{rampsource}$ of the OTA based ramp source 120 is a function of the tail current $I_{tail}$ and of the capacitance $C_{display}$ of the RLCD display 126. That slew rate is:

$$SR_{rampsource} = \exists (I_{tail})/C_{display}$$

where $\exists$ is a current multiplication coefficient that is associated with the OTA topology.

According to the principles of the present invention, a first OTA tail current on the tail current line is constantly drawn through a current source $I_{max\_sample}$ 132. The current source $I_{max\_sample}$ 132 is selected such that the slew rate of the OTA ramp source $SR_{rampsource}$ is sufficient to meet the maximum required slew rate of the ramp source $SR_{rampsource}$. Furthermore, a second current source $I_{fly\_back}$ 134 is selectively switched so as to draw additional OTA tail current on the tail current line 128 during the fly back time $t_{fb}$ 112 (reference FIG. 3). The switch 136 that selectively connects the current source $I_{fly\_back}$ 134 is beneficially a digitally controlled analog switch, with the digital control applied on a control line 138, beneficially form the ramp generator 123.

Figure 5A:
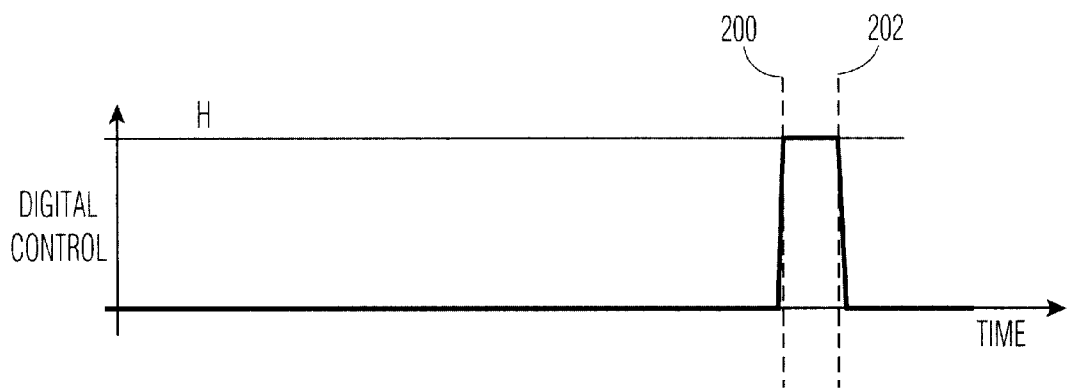
FIG. 5 schematically illustrates time base signals associated with the ramp source illustrated in FIG. 4.
Figure 5B:
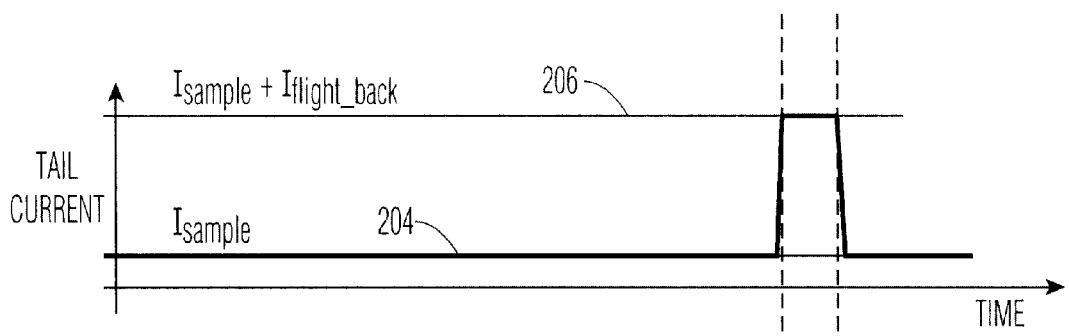
Figure 5C:
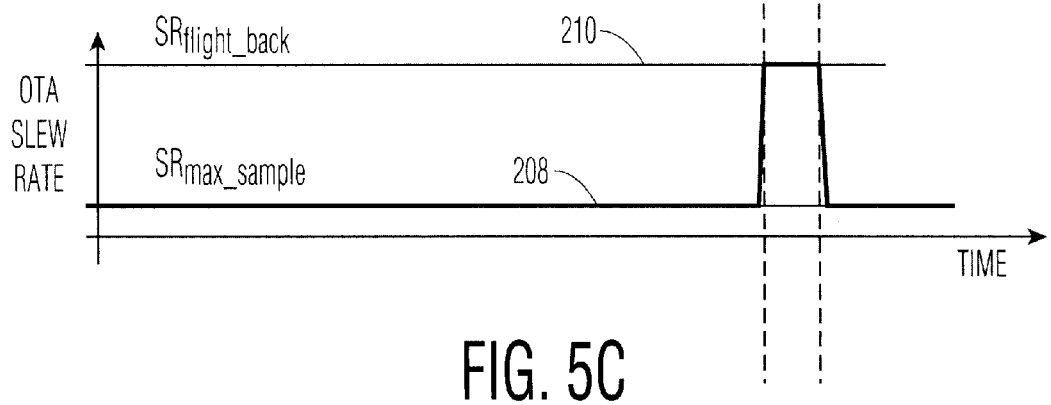

The control of the switch 136, and the resulting actions of the OTA based ramp source 120 is illustrated in FIG. 5. As shown in graph A, which represents the digital control signal applied on the control line 138, the digital control signal goes HIGH to close the switch 138 (see FIG. 4) at the start 200 of the fly back time $t_{fb}$ 112 (see FIG. 3). Furthermore, that digital control signal remains HIGH until the end 202 of the fly back time $t_{fb}$ 112.

Turning now to graph B of FIG. 5, before the digital control signal goes HIGH, the tail current is at the first OTA tail current 204 of the current source $I_{max\_sample}$ 132. However, when the digital control signal goes HIGH, the tail current increases to the value 206, which is the sum of the current source $I_{max\_sample}$ 132 and of the current source $I_{fly\_back}$ 134.

Turning now to graph C of FIG. 5, before the digital control signal goes HIGH, the tail current value 204 enables the OTA ramp source to have a maximum slew rate 208. However, when the digital control signal goes HIGH, the tail current increases, which enables the OTA ramp source to have a maximum slew rate 210. Thus, the maximum OTA ramp source slew rate is digitally controlled by the signal on the control line 138 of FIG. 4.

It will be apparent to those skilled in the art that various modifications and variation can be made in the present invention without departing from the spirit or scope of the invention. Thus, it is intended that the present invention covers the modifications and variations of this invention provided they come within the scope of the appended claims and their equivalents.

What is claimed is:

1. A ramp source, comprising:
   an operational transconductance amplifier (OTA) having an inverting input, a non-inverting input, an output, and a tail current line;
   a load connected to said output;
   a first current source for sinking a first current from said tail current line;
   a switch having a first terminal connected to said tail current line, a second terminal, and a switch control, wherein said first terminal and said second terminal are electrically shorted together when said switch control receives a close signal; and
   a second current source connected to said second terminal;
   wherein said second current source is for sinking a second current from said tail current line when said switch control receives said close signal.

2. A ramp source according to claim 1, wherein said output is electrically connected to said inverting input.

3. A ramp source according to claim 1, wherein said OTA has a first slew rate when said first terminal and said second terminal are not electrically shorted, and a second slew rate when said first terminal and said second terminal are electrically shorted.

4. A ramp source according to claim 3, wherein said second slew rate is greater than said first slew rate.

5. A ramp source according to claim 1, wherein said load includes a liquid crystal display.

6. A ramp source according to claim 1, wherein said non-inverting input is electrically connected to a ramp generator.

7. A ramp source according to claim 6, wherein said ramp generator is for producing a ramp during a ramp period and for producing a return step during a fly back period, wherein said switch control receives said close signal during said fly back period.

8. A liquid crystal display, comprising:
   a plurality of pixel elements in an array of pixel rows and pixel columns, wherein each pixel element includes a ramp input line;
   a ramp generator producing a ramp during a ramp period and a return during a fly back period;
   an operational transconductance amplifier (OTA) having a non-inverting input connected to said ramp generator, an inverting input, an output connected to said pixel element ramp input lines and to said inverting input, and a tail current line;

a first current source for sinking a first current from said tail current line;

a switch having a first terminal that is connected to said tail current line, a second terminal, and a switch control, wherein said first terminal and said second terminal are electrically shorted together when said switch control is closed; and a second current source connected to said second terminal, said second current source for sinking a second current from said tail current line when said switch control is closed; and a control for closing said switch control during said fly back period.

9. A liquid crystal display according to claim 8, wherein said OTA has a first slew rate when said first terminal and said second terminal are not electrically shorted, and a second slew rate when said first terminal and said second terminal are electrically shorted.

10. A liquid crystal display according to claim 9, wherein said second slew rate is greater than said first slew rate.

11. A liquid crystal display according to claim 8, wherein each pixel element further includes a complementary ramp input line.

12. A liquid crystal display according to claim 11, further including a complementary ramp source connected to said complementary ramp input line, wherein said complementary ramp source is for producing a complementary ramp during a ramp period and a complementary return during a fly back period.

13. A liquid crystal display according to claim 8, wherein each pixel element includes a transparent electrode, a pixel electrode, and an interposed liquid crystal layer.

14. A liquid crystal display according to claim 13, wherein each pixel element further includes a storage element connected to said ramp input line, said storage element including a write input line, wherein said storage element is for storing a ramp voltage when said write input line receives a write signal, input lines and to said inverting input, and a tail current line.

15. A liquid crystal display according to claim 14, wherein each pixel element is for receiving polarized light through said transparent electrode, wherein said polarized light reflects off of said pixel electrode of each pixel element, and wherein said liquid crystal layer changes the polarization of said polarized light in accord with the ramp voltage stored by said storage element of each pixel element.

16. A liquid crystal display according to claim 15, wherein said polarized light is formed by passing non-polarized light through a first polarizer.

17. A liquid crystal display according to claim 14, wherein said transparent electrode is shared by each pixel element.

18. A liquid crystal display according to claim 8, wherein said control is a digitally controlled analog switch.

19. An operational transconductance amplifier circuit, comprising:

an operational transconductance amplifier (OTA) having an inverting input, a non-inverting input, an output, and a tail current line;

a load connected to said output;

a first current source for sinking a first current from said tail current line;

a switch having a first terminal connected to said tail current line, a second terminal, and a switch control, wherein said first terminal and said second terminal are electrically shorted together when said switch control receives a close signal; and a second current source connected to said second terminal;

wherein said second current source is for sinking a second current from said tail current line when said switch control receives said close signal.

20. An operational transconductance amplifier circuit according to claim 19, wherein said OTA has a first slew rate when said first terminal and said second terminal are not electrically shorted, and a second slew rate when said first terminal and said second terminal are electrically shorted.

* * * * *